(12) United States Patent
Horbelt (10) Patent No.: US 7,114,088 B2
(45) Date of Patent: Sep. 26, 2006

(54) CIRCUIT AND METHOD FOR THE INPUT OF A START SIGNAL FOR A CONTROLLER

(75) Inventor: Michael Horbelt, Warmbronn (DE)

(73) Assignee: Robert Bosch GmbH, Stuttgart (DE)

( * ) Notice: Subject to any disclaimer, the term of this patent is extended or adjusted under 35 U.S.C. 154(b) by 209 days.

(21) Appl. No.: 10/469,654

(22) PCT Filed: Feb. 25, 2002

(86) PCT No.: PCT/DE02/00681

§ 371 (c)(1),
(2), (4) Date: Feb. 13, 2004

(87) PCT Pub. No.: WO02/071585

PCT Pub. Date: Sep. 12, 2002

(65) Prior Publication Data

US 2004/0135609 A1    Jul. 15, 2004

(30) Foreign Application Priority Data

Mar. 1, 2001   (DE)   ............... 101 09 796

(51) Int. Cl.
*G06F 1/26*   (2006.01)

(52) U.S. Cl. ..................................... 713/322; 713/601
(58) Field of Classification Search ................ 713/322, 713/601, 327
See application file for complete search history.

(56) References Cited

U.S. PATENT DOCUMENTS

| | | | | |
|---|---|---|---|---|
| 3,911,391 A | * | 10/1975 | Held et al. ................ | 180/274 |
| 4,539,957 A | * | 9/1985 | Haraguchi et al. ...... | 123/406.38 |
| 2003/0206007 A1 | * | 11/2003 | Gass et al. ............ | 324/207.17 |

FOREIGN PATENT DOCUMENTS

| | | |
|---|---|---|
| DE | 42 26 704 | 2/1994 |
| DE | 196 45 944 | 5/1998 |
| WO | WO 91 02303 | 2/1991 |

* cited by examiner

*Primary Examiner*—Thomas Lee
*Assistant Examiner*—Hari Patel
(74) *Attorney, Agent, or Firm*—Kenyon & Kenyon LLP (57) ABSTRACT

A circuit and method for the input of a start signal, a controller being transferred from a first state into a second state as a function of the start signal, the energy consumption of the controller in the second state being greater than in the first state, the circuit having a clocked energy source which emits a timed energy signal, and the start signal is formed as a function of the energy signal.

9 Claims, 6 Drawing Sheets

CIRCUIT AND METHOD FOR THE INPUT OF A START SIGNAL FOR A CONTROLLER

FIELD OF THE INVENTION

The present invention relates to a circuit and a method for the input of a start signal, a controller being transferred from a first state to a second state as a function of the start signal; the energy consumption of the controller in the second state being higher than in the first state.

BACKGROUND INFORMATION

German Patent Application No. DE 196 45 944 A1 shows a control unit for a vehicle electrical system having at least two batteries, which are able to be loaded by a generator, and which are used for supplying various users. Information is fed to the control unit and consequently also to the microcontroller contained in it via various connections. The control unit and the microcontroller contained in it are able to output control signals via other connections. As a function of specifiable data, the vehicle electrical system control unit opens or closes the connection between the two batteries, and goes into a sleep mode after switching off. In this context, for the wake-up from the sleep mode, a field effect transistor is patched through for putting into operation the control unit by supplying a signal.

Control units like the vehicle electrical system control unit just described are, generally, sent into a standby mode or a sleep mode based on the no-signal current requirements, or rather their no-signal current consumption, when it happens not to be needed, or rather, is not being used. This applies to all control units, just as, for instance, to the vehicle electrical system control unit or comfort control units or peripheral control units in particular in a vehicle, which do not have to execute an uninterrupted processing of tasks with respect to their function. This also applies, for instance, to control units in locking systems, control units which drive servomotors such as, for example, for window lifters or a sunroof, or even an outer mirror adjustment.

All these control units which are intermittently able to be put into standby mode or sleep mode, independent of whether they are being used in the vehicle or elsewhere, are cyclically activated in a sort of polling operation. This applies to the controller, as well as parts of the periphery. It thereby becomes possible, during these active phases, to record time-critical and other external events and signals, such as switching positions. Depending on that, the entire control unit is then activated anew or remains in sleep mode or standy mode. This method leads to a high current consumption of the control unit.

If, for example, several control units are simultaneously activated in this way, then for each control unit only a certain part of the overall available energy or current is usable. In this manner, either not many control units are able to be operated simultaneously like this, or attempts are made to solve the problem, in that very large scanning times, that is, cycle times, are selected between two activity phases.

Thus, the related art has not been able to yield optimum results in all regards.

SUMMARY

The present invention relates to a method and a circuit for inputting a start signal. In an example embodiment, as a function of the start signal, a controller is transferred from a first state, a standby mode or a sleep mode, into a second state of an active nature. The energy consumption of the controller in the second state is higher than in the first state. In an advantageous manner, this may be achieved by providing the circuit with a clocked energy source which emits an energy signal within the scope of this clocking. The start signal is formed as a function of this energy signal.

By doing this, in an advantageous manner, a reduction in the no-signal current consumption of the control unit may be achieved in connection with the example circuit according to the present invention, while at the same time the real-time capability with respect to recording the signals during the first energy-poor state, i.e., the sleep mode or standby mode is maintained, to a great extent.

By the use of the example wake-up circuit according to the present invention, the actual control unit may even be switched off completely, and only the wake-up circuit, that is, the circuitry, may be supplied with energy. Thereby, chiefly the rest energy consumption, especially the no-signal current consumption of the wake-up circuitry is relevant, which is able to be reduced to a minimum by the use of the clocked energy source or a clocked energy signal.

This also eliminates the necessity, for reasons of energy or current, of recording and processing the signals which may lead to the activation of the control unit or the controller only at large time intervals.

By using a threshold circuit element, especially a comparator, which is connected to the clocked energy source, a simple possibility of detecting the signal state is yielded.

If, in an advantageous manner, a storage arrangement having at least one storage cell is connected to the threshold circuit element, the signal state may be preserved, and thereby made better able to be processed and compared. In particular, if the storage means is designed as a shift register and the storage cell content is shifted further at the pulse of the clocked energy source, complex selection methods and comparison methods are possible which then, in conclusion, result in the emission of a start signal as a wake-up signal to the microcontroller.

This comparison possibility comes about in an advantageous manner in that a further storage arrangement, likewise in particular designed as a register, especially as a shift register, contains a certain storage content, particularly in the form of a bit pattern, and by the comparison of the bit patterns a start signal is triggered. For this, in an advantageous manner, a simple evaluation arrangement in the form of a simple logic may be used, this evaluation arrangement being connected to the at least one storage arrangement and emitting the start signal to the controller.

In this context, it is advantageously also possible that, when two storage arrangements are used for the comparison, in an active phase of the controller, one storage arrangement is filled by the controller with specifiable content, so that the controller itself is able to specify the start criteria.

In another example embodiment, the clocked energy source is preferably designed so that it may be adjusted, so that the energy signal emitted in clock time is able to be changed in its level. The use of such clocked energy signals that have their level changed then makes possible in an advantageous way the yield of additional data which may be used, for example, for diagnostic purposes.

The level of the energy signal is advantageously executed by a control arrangement, in particular a state machine, whereby a specifiable change in the energy signal may be implemented.

Instead of, or additionally to the use an energy signal variable in its level, a reference arrangement may advantageously be provided, by which the threshold value of the threshold circuit element is able to be changed.

BRIEF DESCRIPTION OF THE DRAWINGS

The present invention is explained in greater detail with reference to the example embodiments shown in the drawings.

DETAILED DESCRIPTION OF EXAMPLE EMBODIMENTS

For reasons of clarity, various options of the present invention are appropriately shown by different figures. However, according to the present invention it is possible to combine the different figures or the options shown in them with one another.

Figure 1:
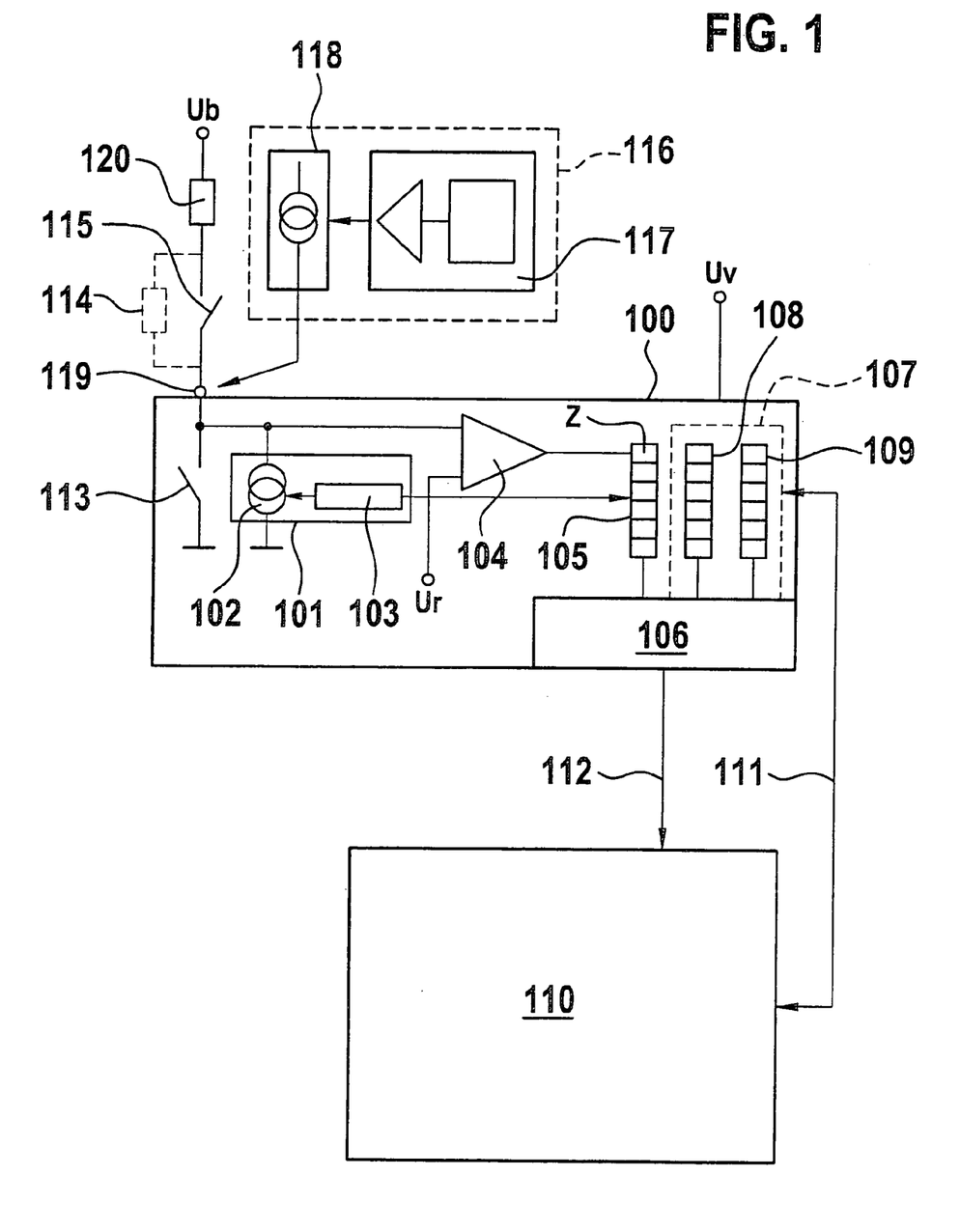
FIG. 1 shows a wake-up circuit, according to an example embodiment of the present invention, in connection with possibilities of generating input signals as well as connection to the controller.

FIG. 1 shows a circuit 100 according to an example embodiment of the present invention, having a controllable energy source, in particular a current source, as well as a timing pulse means 103 combined in a clocked energy source 101. The energy source may be a voltage source, a charge source, a current source, etc.

For reasons of clarity, we speak of a current source as the preferred design case.

Clocked current source 101 is connected to a threshold value circuit element, especially a comparator 104, at whose second input there is a reference threshold Ur. Threshold value circuit element 104, on its part, is connected to a storage arrangement 105, in particular a register, for instance a shift register, whose individual cells are denoted by Z. This storage arrangement 105, in turn, has a connection to an evaluation arrangement 106, in particular a simple comparison logic.

A further storage arrangement is shown as 107, especially registers 108 and 109, which, on the one hand, may be accommodated within evaluation arrangement 106, or outside of it, but within circuit 100. A start signal or wake-up signal is transmitted to the microcontroller or controller 110 via connection 112. In this context, the wake-up signal may also first operate a circuit element, not explicitly shown here, and by which the energy supply of controller 110 is made available. The circuit element in this case may be positioned externally or internally to controller 110, or may be a part of 100.

Optionally, controller 110 may be connected via connection 111, unidirectionally or bidirectionally to optional registers 108 and 109, for instance by a serial interface, such as an SPI (serial peripheral interface).

At input terminal 119 of circuit 100, a switch 115 is connected, which is connected via a load 120, particularly a resistor, to a voltage Ub, which particularly corresponds to the battery voltage in the vehicle. Circuit 100 itself is also supplied with energy using a supply voltage Uv, Uv being able to correspond to battery voltage Ub, to be formed from it, or to correspond to its own energy supply.

Additional energy supplies, such as of controller 110 and corresponding ground connections have been omitted, since these are conventional.

A dashed line shows a resistor at switch 115, which represents parasitic resistances of switch 115, and which is created, for example, by manufacturing inaccuracies, material properties or aging and/or wear of the switch.

An optional circuit is shown by 116, which also performs a signal generation to terminal 119, in which a controllable energy source, especially a controllable current source 118 is controlled by an analog circuit 117. This circuit may be present instead of, or in addition to switch 115.

Figure 2:
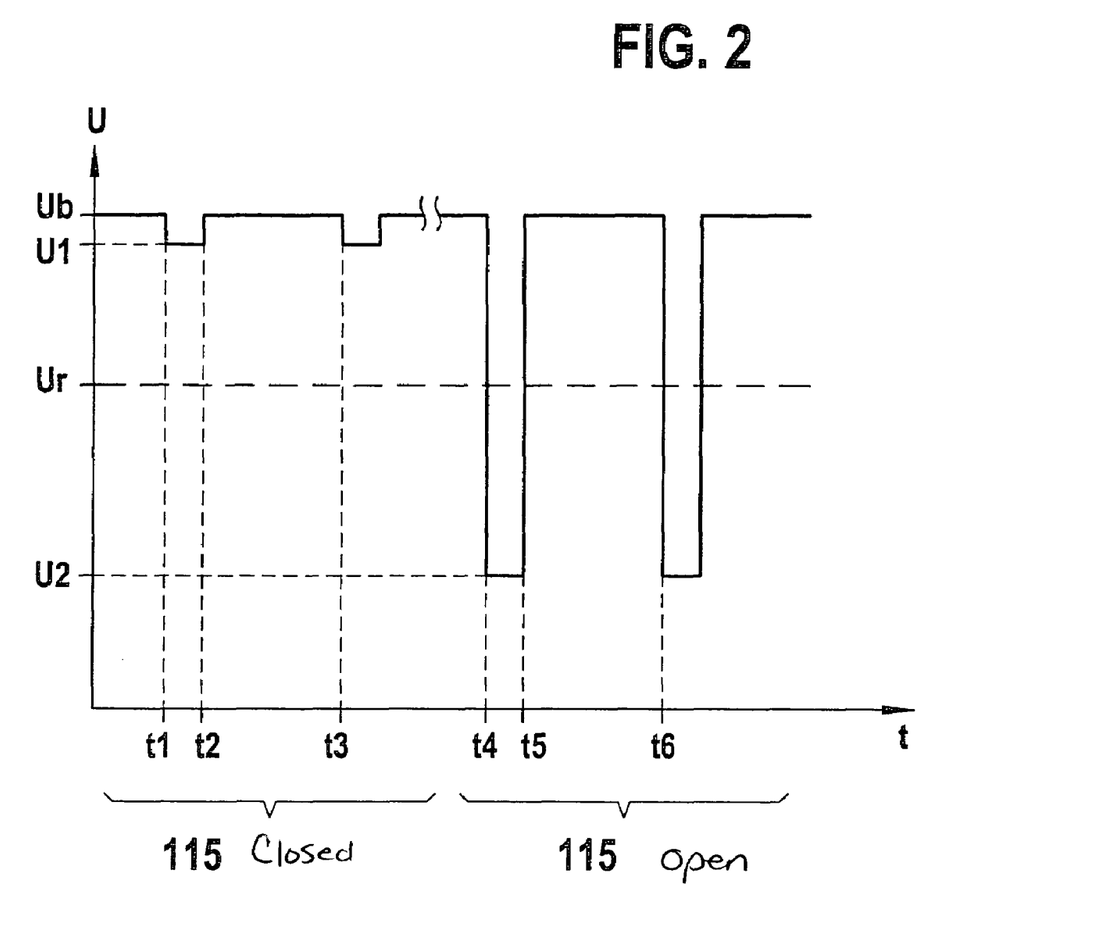
FIG. 2 shows the signal pattern for a simply timed signal energy source.

The functional procedure will now be further explained in the light of FIG. 2. It is true, in general, that comments on the individual and also subsequent example embodiments are not limited to these, but, generally, are valid for all embodiments, taking into consideration that the options or the features of the individual specific embodiments may be combined arbitrarily to form new specific embodiments.

Current source 102 is clocked by clock pulse generator 103. In the voltage-time diagram U(t) of FIG. 2, Ub illustrates the battery voltage and Ur the threshold value, or rather, here, the reference voltage. When switch 115 is closed, voltage Ub is present at input 119. At point in time t1, a pulse I of width t1 to t2 is triggered by clock pulse generator 103. Thus, when the switch is closed, almost the entire voltage Ub is present at the comparator input, that is, driven only to a slight extent by current source 102. A voltage level U1 comes about, which differs from Ub by the voltage drop at load 120 as well as at the internal resistance of current source 102 and parasitic resistor 114. At an appropriately dimensioned (setting value) of current source 102, the voltage drop is at level U1, that is, only slightly below supply voltage Ub.

Since level U1 lies above reference threshold Ur, the comparator, i.e., the threshold value circuit element 104 does not switch, and into the cell of register 105 a 0 is written. At point t3, clocked current source 101 again emits a pulse I with switch 115 closed, whereby here too a 0 is written into the register. Expediently for this, the register has applied to it the same clock pulse of clock pulse generator 103 as clocked energy source 101, whereby the results of the threshold value comparison are written into the cells of the register one after another.

In the simplest case, only one register cell is present for this. But an arbitrary number of register cells may be used, depending on the complexity of the specific embodiment. Consequently, the clock pulse in this specific embodiment from t1 to t3 has an on/off ratio of 1 to 5 with reference to pulse ranges t1 to t2, which corresponds to I. At time t4 switch 115 is opened, whereby, when a pulse I is emitted, a level U2 sets in here from t4 to t5 at the input to the comparator, from the clocked current source. This level then comes about again at t6, where again a pulse I is emitted from the clocked current source, using the on/off ratio of 1 to 5, given here.

Using this procedure, since the object to be measured only has relatively low current values applied to it, an additional switch 113 is provided. This may be operated in phases in which the no-signal current requirement is estimated to be noncritical, so that possibly required switch contact currents may be set.

It already becomes clear from this example that, for instance, at an emission of 50 µA of pulse I at t4, this effectively yields a no-signal current consumption of at most 10 µA over clock pulse t4 to t6, for example at a clock ratio of 1 to 5. This is clearly lower than the high current consumption by controller 110, so that, on the one hand, several controllers may be used simultaneously with the aid of the wake-up circuit, and on the other hand, real-time scanning clock pulses of the input signals, here of switch 115, may be carried out.

For example, controller 110 may make inputs for registers 108 and 109 via connecting line 111, based on which logic 106 may then compare whether the scanning pattern in register 105, which is formed according to the respective pulses, agrees with the ones required in 108 and/or 109 for the purpose of generating a start signal via line 112. Likewise, for reasons of security, in logic 106 one may carry out any exclusionary method, e.g., two of three, six of eight, five of ten, etc., with regard to the register cells.

Besides the use of switch positions, other signals may also be used for comparison or scanned, for instance, analog signals of an analog circuit 117, the analog circuit driving a controllable current source 118, and the current signals then being able to be compared.

Figure 3:
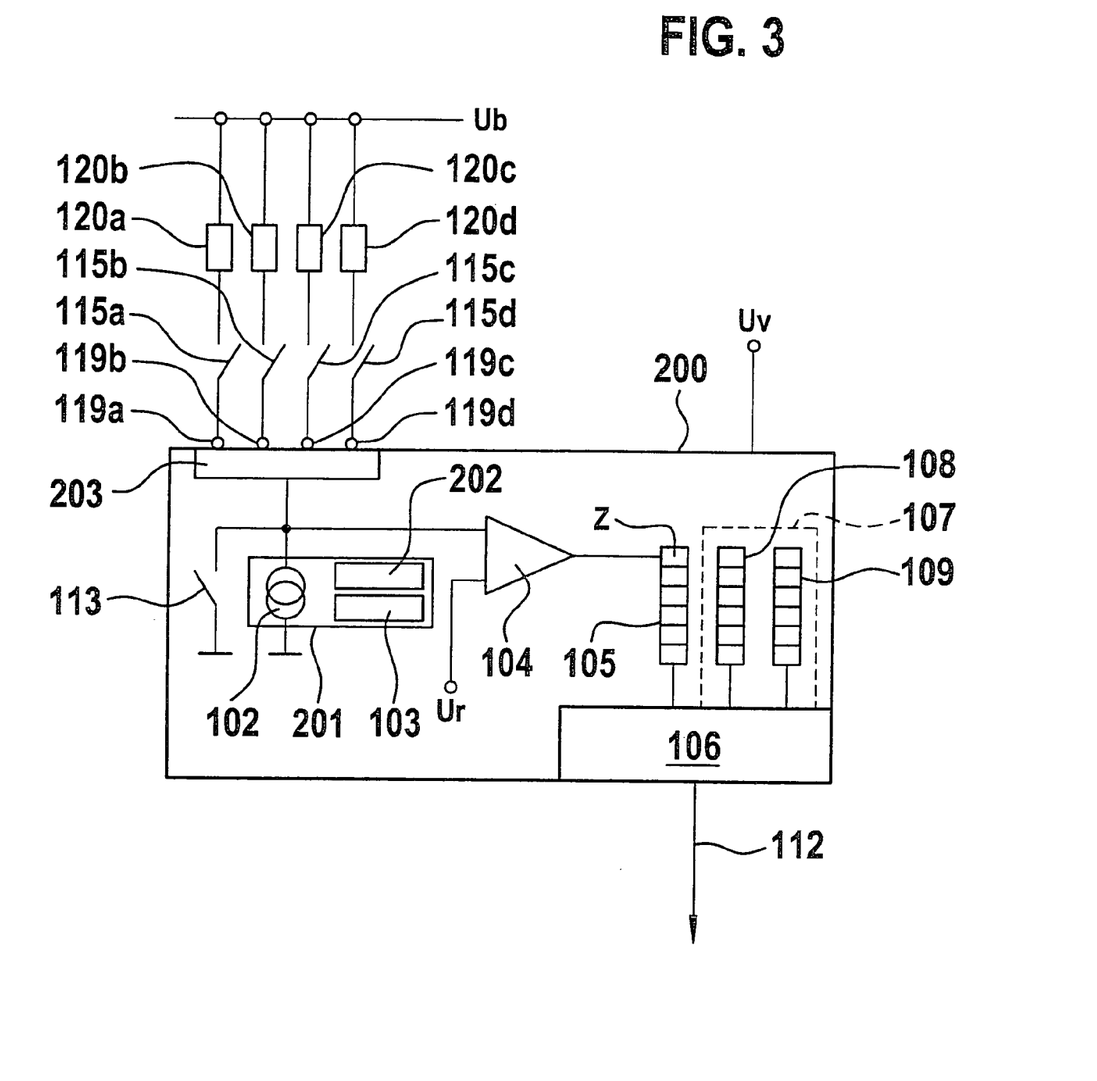
FIG. 3 shows a circuit according to an example embodiment of the present invention, having signal connections and the option of changing the level of the energy signal.

FIG. 3 shows a further example embodiment, similar elements not being described again.

In this context, circuit 200 additionally includes a selecting element 203 by which various connections 119a to 119d may one after another be scanned and have the current pulse of the clocked current source applied to them. Thereby several input signals of several switches 115a to 115d and appertaining resistors 120a to 120d may be tested.

FIG. 3 also includes a control arrangement 202, such as a state machine, by which a change in the pulse level of the emitted current pulses is possible. This is then explained in more detail in FIG. 4. Thus, for example, at point in time t7 a first pulse, again of width I is emitted by the current source from t7 to t8.

Figure 4:
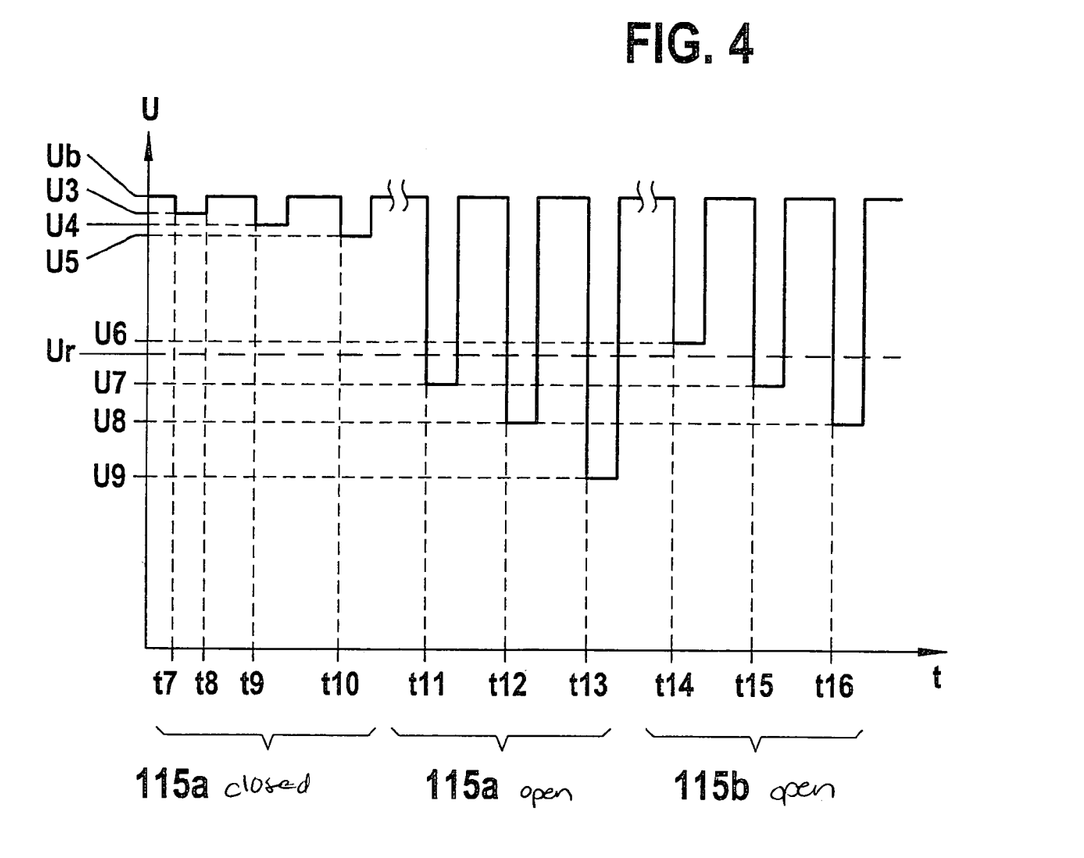
FIG. 4 shows the signal pattern in response to variations of the level of the energy signal.

Here, for example, an on/off ratio of 1 to 3 is selected, so that, therefore, every three scanning steps a new pulse I is emitted. Thus, when switch 115a is closed, for example, three times in a row, at points t7, t9 and t10 a pulse I is emitted by the current source. This pulse of width I is now varied in its level. This occurs by control arrangement 202, particularly a state machine. This yields different voltage levels U3, U4 and U5, which in this case all lie above reference Ur. Thereby, in the register, in the first three cells, in each case 0, i.e., 0 0 0 is written in. As the procedure continues, with switch 115a open, at points t11, t12, and t13 a pulse I of variable level is repeatedly emitted, whereupon voltage levels U7, U8 and U9 set in. In this case, all three voltage levels lie below the threshold voltage, as a result of which 1 1 1 is written into the registers. In the case of an additional switch, such as 115b in the open position, voltage levels U6, U7 and U8 set in, for example, when three pulses are emitted at t14, t15 and t16.

For reasons of clarity, in this case, the same voltage level is selected for switch 115a and switch 115b for the pulses at t15 and t11, as well as at t12 and t16. Generally, however, they may be and will be different.

In any case, what is shown with 115b open is that voltage level U6 lies above reference voltage Ur. Consequently, for example, for switch 115b open, on the one hand, for security reasons a two of three evaluation may be reached by the logic, meaning that a start signal is emitted when two pulses yield voltage levels below the reference voltage, or, on the other hand, at known current values, conclusions may be reached on the wear of a switch over time, and here, above all, the parasitic resistances should be addressed. It should be emphasized once more at this point that a start signal is emitted only when a signal change (e.g., open/closed) that was established before has occurred.

FIG. 4 shows that, on the one hand, because of the different pulse levels, the impedance of each respective switch or its resistance is able to be determined, because it is able to be detected at which current the exceeding of the threshold voltage exists, shown by a bit pattern in the register, and on the other hand, conditions of wear of the switches may be detected via a fingerprint of a switch which was created before. It means that the switch may be tested in succession beforehand using certain predefined currents, whereby a bit sequence comes about in the register. If the switch now undergoes wear, its resistance changes because of the parasitic effects, and the difference in the bit pattern of the register, in response to a comparison, for example, with the optionally shown additional registers in 107, that is 108 or 109, gives information concerning aging and wear, and may consequently be used for diagnosis purposes.

That is, the circuit corresponds to a wake-up circuit having a current source that may be set and clocked, which is connected to a threshold value evaluation, individual comparison results being registered. By variations of the current value and/or the switching thresholds, as is further shown in FIGS. 5 and 6, in addition to the switching states open/closed, the electrical properties, specifically, for instance, the fingerprint of the switch, may also be determined and elucidated. And all this is done at a very low no-signal current consumption.

Figure 5:
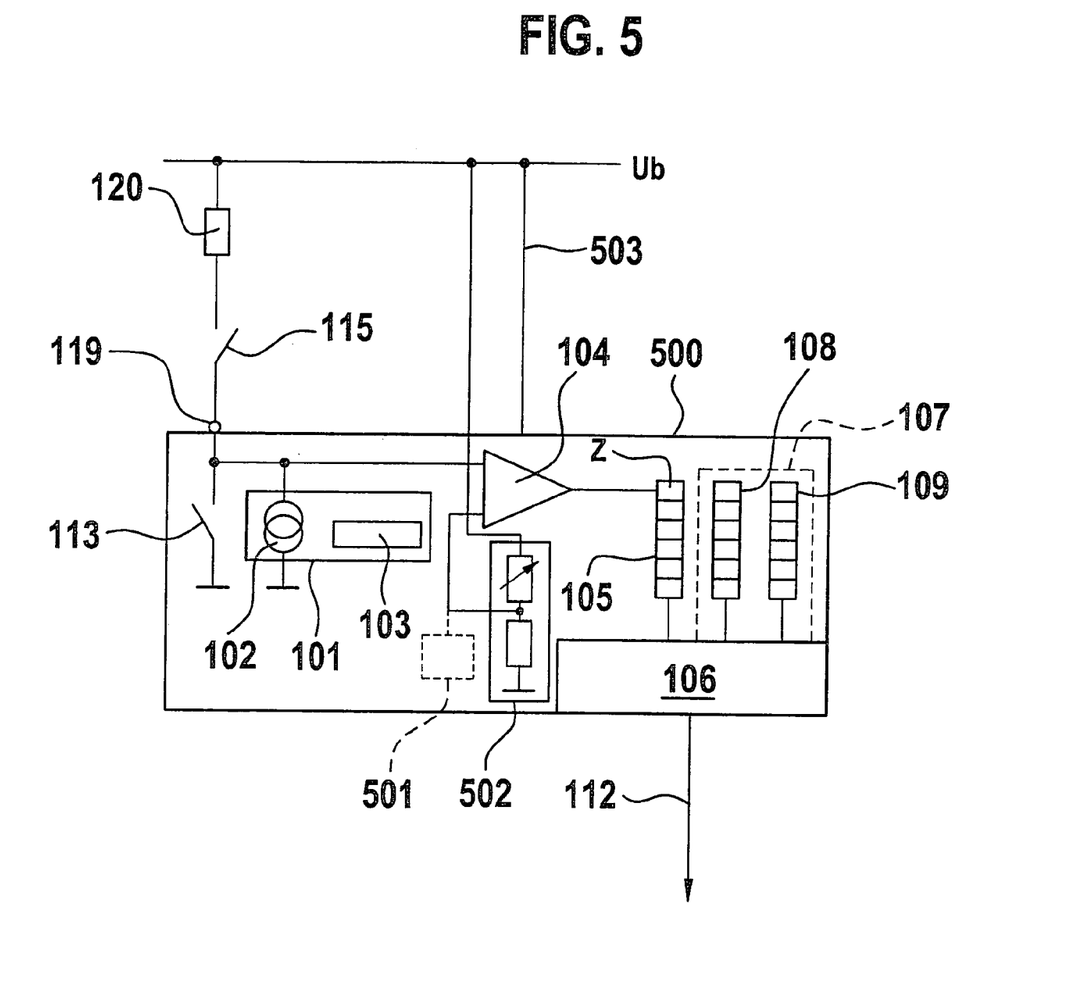
FIG. 5 shows a circuit according to an example embodiment of the present invention, having a reference arrangement for varying the comparison threshold.

An additional example embodiment in FIG. 5 shows a circuit 500, which besides the already mentioned elements also has a voltage divider having an adjustable resistance 502, as well as an additional reference setting means, such as an adjustable voltage source 501. In this case, for example, Ub is selected as supply voltage for circuit 500 via line 503, which, as has been mentioned, may correspond to the aforementioned supply voltage Uv, or may differ from it, as was mentioned in the previous examples.

Figure 6:
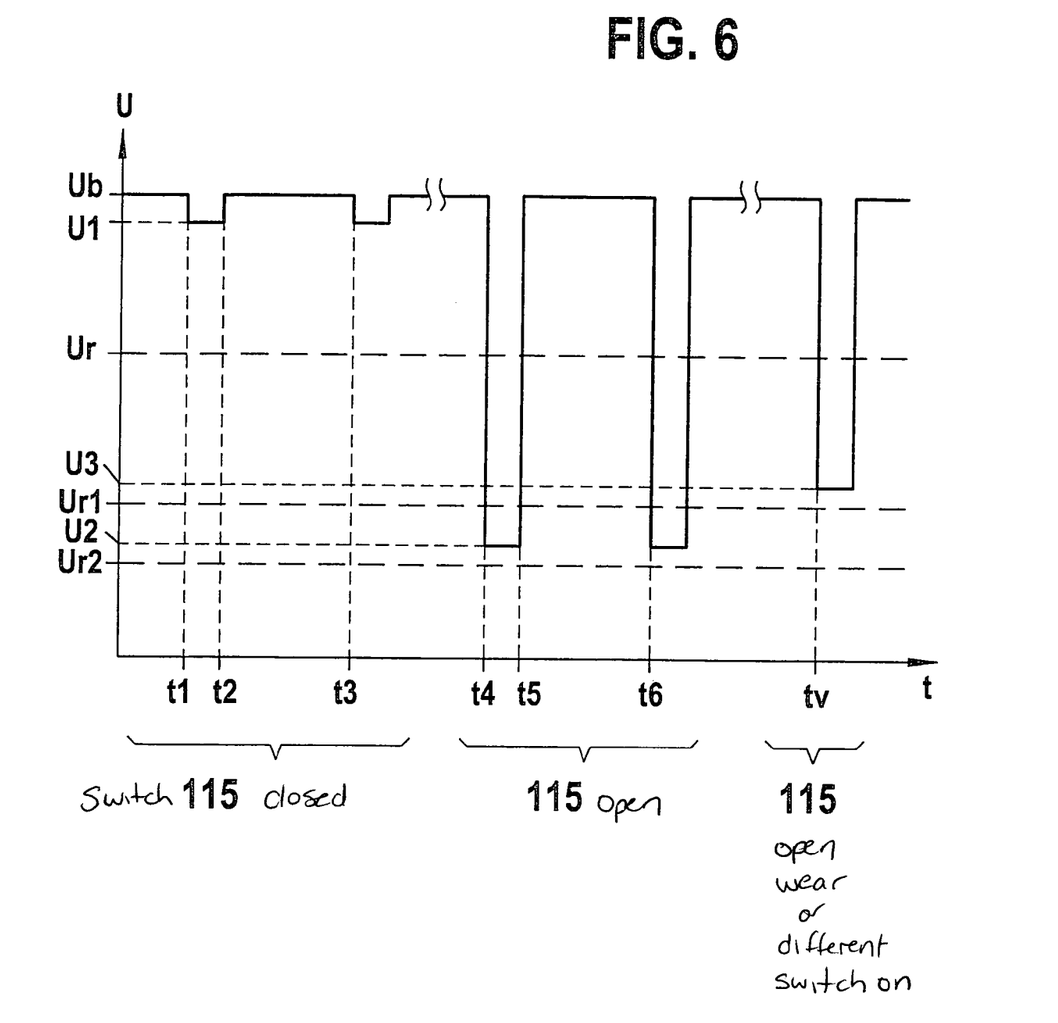
FIG. 6 shows the signal pattern in response to variations of the comparison threshold.

The effect of this circuit will now be explained in FIG. 6 in more detail. By using reference arrangement 501 or 502, the reference thresholds, which were previously fixed at Ur, may now be varied.

With that, as shown by reference thresholds Ur1 and Ur2, a comparable evaluation may be achieved, as is possible by varying the currents or the pulse level.

That means here too, that an open switch 115 may be tested by varying the reference from Ur to Ur1 or Ur2, to see whether level U2 lies above or below, as a function of the pulse current. By forming such a corridor from reference thresholds, the same diagnostic properties may then be achieved as by the variation of the currents. Thus, for example, at point Tv and switch 115 open, one may draw a conclusion as to its wear at a voltage level U3, or the resistance value or the impedance of another switch may be tested by changing the threshold.

That means, that in all these exemplary embodiments, by using the clocked energy source, a lower rest energy value consumption may be achieved, and controller 110 may be switched off. Thus, the supplier of a signal that is to be monitored, such as a switch, is supplied with current in pulse fashion from an energy source shown, particularly a current source. In this context, the clock pulse generator determines the time pattern as well as the taking-over of each measuring result into register 105 of the actual values. Logic block 106 makes the decision on emitting a start signal, that is, a wake-up signal to the controller, and it does it in the light of, for example, the overall result in the register cells, such as 0100111, as well as the status bit of this energy source that is present, thus, for example, in the case of the switch, whether open or closed.

This result in actual value register 105 may be compared, for this purpose, to setpoint values, that may be input from the controller, in setpoint value registers, these setpoint value registers being able to be made available also from the outside, such as via the CAN controller and also using an SPI or a similar interface.

In this context, the current values and/or switching thresholds may be set in individual fashion—globally or individually for each switch or individually for each signal supplier.

What is claimed is:

1. A circuit for generating a start signal, comprising:
   a clocked energy source configured to emit a time energy signal, the start signal being formed as a function of the energy signal, a controller being transferred from a first state into a second state as a function of the start signal, an energy consumption of the controller in the second state being greater than an energy consumption of the controller in the first state;
   a threshold value circuit element connected to the clocked energy source; and
   a first storage arrangement including at least one register storage cell, the first storage arrangement connected to the threshold value circuit, wherein an output of the threshold value circuit is stored in the first storage arrangement, and wherein the start signal is formed as a function of the stored output of the threshold value circuit.

2. The circuit as recited in claim 1, wherein the first storage arrangement includes a shift register, a content of the shift register being shifted in time with the clocked energy source.

3. The circuit as recited in claim 1, further comprising:
   at least one additional storage arrangement having at least one storage cell, the start signal being formed as a function of a comparison of a content of the first storage arrangement and a content of the at least one additional storage arrangement.

4. The circuit as recited in claim 1, further comprising:
   an evaluation arrangement, the first storage arrangement being connected to the evaluation arrangement, the evaluation arrangement configured to form the start signal.

5. The circuit according to claim 3, wherein the controller is connected to the at least one additional storage arrangement, the controller configured to specify the content of the at least one additional storage arrangement when the controller is in the second state.

6. The circuit according to claim 1, wherein the clocked energy source is adjustable and a level of the energy signal emitted is changeable.

7. The circuit according to claim 6, wherein the clocked energy source one of: i) includes a control arrangement, or ii) is connected to a control arrangement, the control arrangement configured to control changing of the level of the energy signal.

8. The circuit according to claim 1, further comprising:
   a reference arrangement, a threshold value of the threshold value circuit element configured to be changed by the reference arrangement.

9. A method for generating a start signal, a controller being transferred from a first state into a second state as a function of the start signal, an energy consumption of the controller in the second state being greater than an energy consumption of the controller in the first state, the method comprising:
   generating a clocked energy signal;
   supplying a second signal dependent on the energy signal to a threshold value circuit element;
   supplying a reference signal to the threshold value circuit element;
   comparing, using the threshold value circuit element, the second signal with the reference signal, wherein a result of the comparison is stored in at least one register storage cell; and
   providing the start signal as a function of the stored result of the comparison.

* * * * *